(12) United States Patent
Nagata

(10) Patent No.: US 11,444,186 B2
(45) Date of Patent: Sep. 13, 2022

(54) SEMICONDUCTOR DEVICE

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/082,802

(22) Filed: Oct. 28, 2020

(65) Prior Publication Data

US 2021/0151588 A1 May 20, 2021

(30) Foreign Application Priority Data

Nov. 18, 2019 (JP) .............................. JP2019-207941

(51) Int. Cl.
| | | |
|---|---|---|
| *H01L 29/739* | (2006.01) | |
| *H01L 29/06* | (2006.01) | |
| *H01L 29/417* | (2006.01) | |
| *H01L 29/423* | (2006.01) | |

(52) U.S. Cl.
CPC ...... *H01L 29/7397* (2013.01); *H01L 29/0649* (2013.01); *H01L 29/41708* (2013.01); *H01L 29/4236* (2013.01)

(58) Field of Classification Search
CPC ... H01L 29/06; H01L 29/064; H01L 29/0649; H01L 29/41; H01L 29/417; H01L 29/417; H01L 29/41708; H01L 29/42; H01L 29/423; H01L 29/4236; H01L 29/73; H01L 29/739; H01L 29/7397
USPC ........................................................ 257/197
See application file for complete search history.

(56) References Cited

U.S. PATENT DOCUMENTS

| | | |
|---|---|---|
| 7,868,381 B1 | 1/2011 | Bhalla et al. |
| 10,937,899 B1* | 3/2021 | Nagata .................. H01L 29/407 |
| 2009/0189181 A1 | 7/2009 | Koyama et al. |
| 2010/0078674 A1 | 4/2010 | Seok et al. |
| 2013/0328105 A1 | 12/2013 | Matsuura |
| 2015/0349103 A1 | 12/2015 | Onozawa et al. |
| 2016/0064537 A1 | 3/2016 | Okawara |
| 2018/0277668 A1 | 9/2018 | Nagata |
| 2019/0181254 A1 | 6/2019 | Nagata |

FOREIGN PATENT DOCUMENTS

| | | |
|---|---|---|
| JP | 2013-258190 A | 12/2013 |
| JP | 2019024133 A | 2/2019 |
| JP | 2019-102759 A | 6/2019 |
| WO | 2014/174911 A1 | 10/2014 |

OTHER PUBLICATIONS

Extended European Search Report issued in corresponding European Patent Application No. 20208201.2-1212, dated Apr. 19, 2021.

* cited by examiner

*Primary Examiner* — Monica D Harrison
(74) *Attorney, Agent, or Firm* — McDermott Will & Emery LLP

(57) ABSTRACT

A semiconductor device includes a semiconductor substrate, first and second trench electrodes formed on the semiconductor substrate, a floating layer of a first conductivity type formed around the first and second trench electrodes, a floating separation layer of a second conductivity type formed between the first and second trench electrodes and contacted with the floating layer of the first conductivity type and a floating layer control gate disposed on the floating separation layer of the second conductivity type.

19 Claims, 26 Drawing Sheets

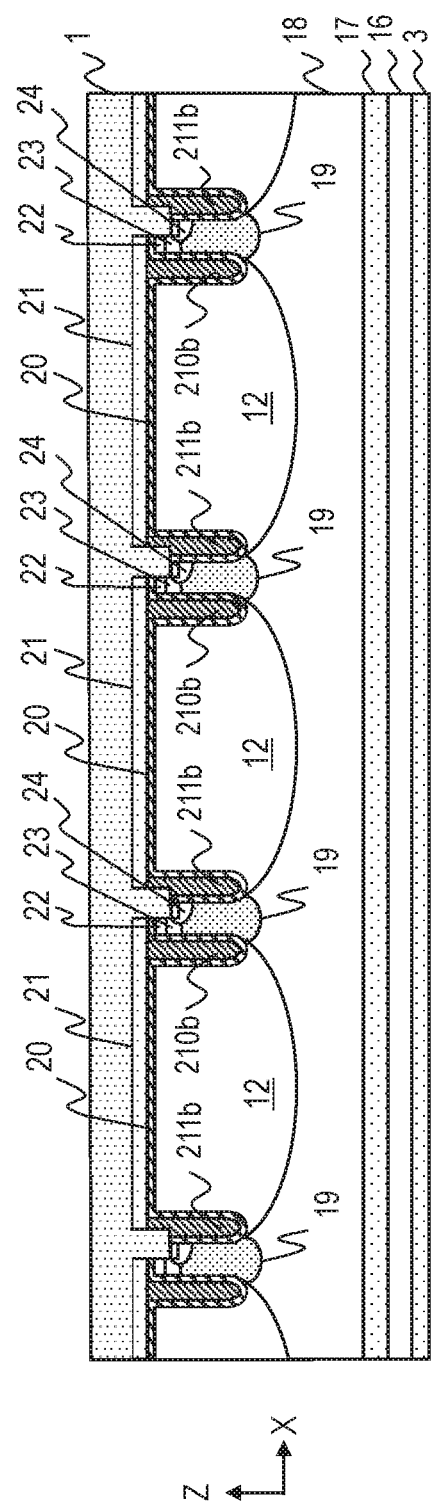

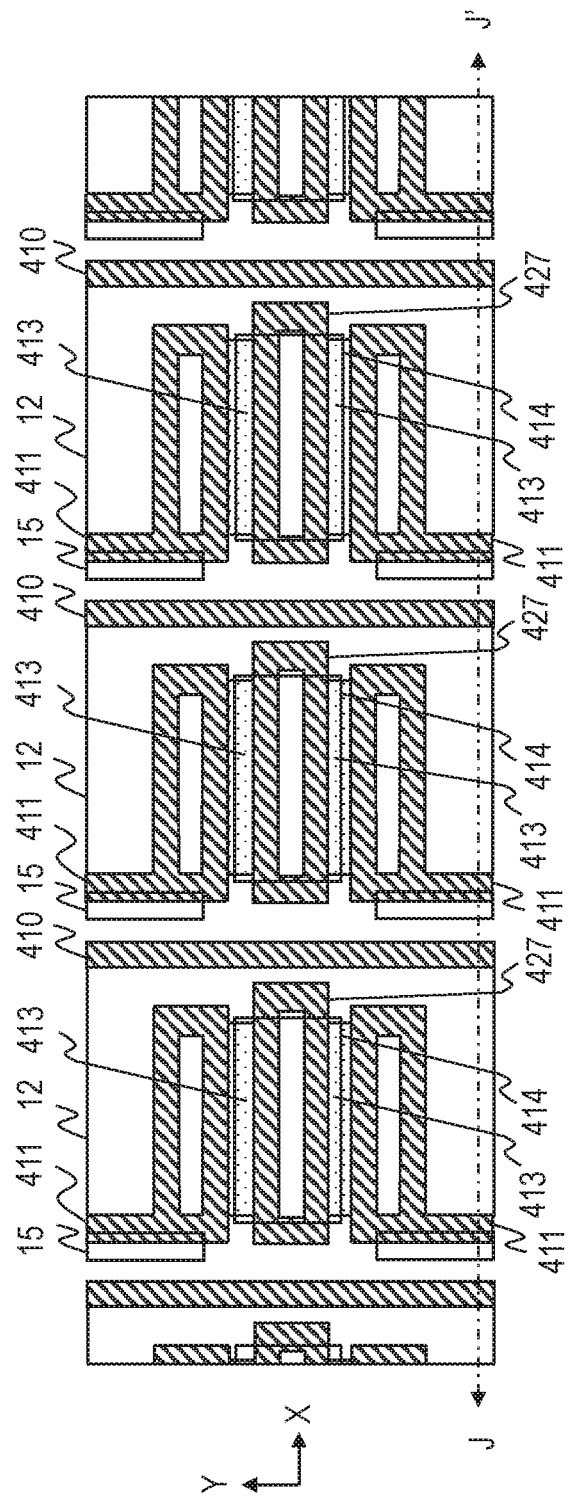

SEMICONDUCTOR DEVICE

CROSS-REFERENCE TO RELATED APPLICATIONS

The disclosure of Japanese Patent Application No. 2019-207941 filed on Nov. 18, 2019 including the specification, drawings and abstract is incorporated herein by reference in its entirety.

BACKGROUND

The present application relates to a semiconductor device and its manufacturing method, and more particularly to a semiconductor device with an insulated gate bipolar transistor (IGBT).

Trench-gate type IGBT are widely used as IGBT with low on-resistance, i.e., low forward-saturation-voltage Vce(sat). And, the IE-type IGBT utilizing IE (Injection Enhancement) effect has been developed with the purpose of reducing the conduction resistance and on-voltage in the on-state of the trench gate type IGBT. In the IE-type IGBT, active cells and inactive cells (also referred to as floating layers) are alternately arranged. By providing the floating layer, holes are less likely to be discharged from the emitter electrodes when IGBT is in the on-state, and the concentration of carriers (holes) accumulated in the drift layer can be increased.

Patent Document 1 discloses an IGBT structure in which active cell regions and inactive cell regions are alternately arranged in the X-axis direction. In the active cell region, an active section provided with an emitter region and an inactive section provided with a body contact portion are arranged. With this structure, it is possible to reduce the discharge path of the carrier (hole), the switching loss at the turn-on of IGBT is improved.

Patent Document 2 discloses an IGBT in which the active cell regions and the inactive cell regions are alternately arranged in the X-axis directions. Further, in the active cell region, a hybrid cell region having a body contact, an n-type separation region, the floating region having no body contact is arranged in the Y-axis direction. With this structure, it is possible to reduce the discharge path of the carrier (hole), and the switching loss at the turn-on of IGBT is improved.

PRIOR-ART DOCUMENT

Patent Document

[Patent Document 1] Japanese Unexamined Patent Application Publication No. 2013-258190
[Patent Document 2] Japanese Unexamined Patent Application Publication No. 2019-102759

SUMMARY

The techniques described in Patent Document 1 and 2 allow for enhanced IE-effects, i.e., carrier (hole) storage capabilities. However, as the carrier accumulation quantity increases, the switching loss (Eoff) at the time of turn-off increases. It is required to achieve both the improvement of the IE effect and the reduction of Eoff.

Other objects and novel features will become apparent from the description of the specification and drawings.

Means of Solving the Problems

A semiconductor device according to an embodiment comprises semiconductor substrate, first and second trench electrodes formed in the semiconductor substrate, a floating layer of a first conductivity type formed around the first and second trench electrodes, a floating layer control gate of a second conductivity type formed between the first and second trench electrodes and contacting with the floating layer of the first conductivity type, and a floating layer control gate disposed above the floating separation layer of the second conductivity type.

In semiconductor device according to an embodiment, in IGBT, to achieve both improved IE-effect and reduced switching loss (Eoff) at turn-off.

BRIEF DESCRIPTION OF THE DRAWINGS

FIG. 17B is a cross-sectional view of a semiconductor chip according to the sixth modified example of the second embodiment.

FIG. 19A is a plan view of a semiconductor chip according to a fourth embodiment.

DETAILED DESCRIPTION

Figure 1:
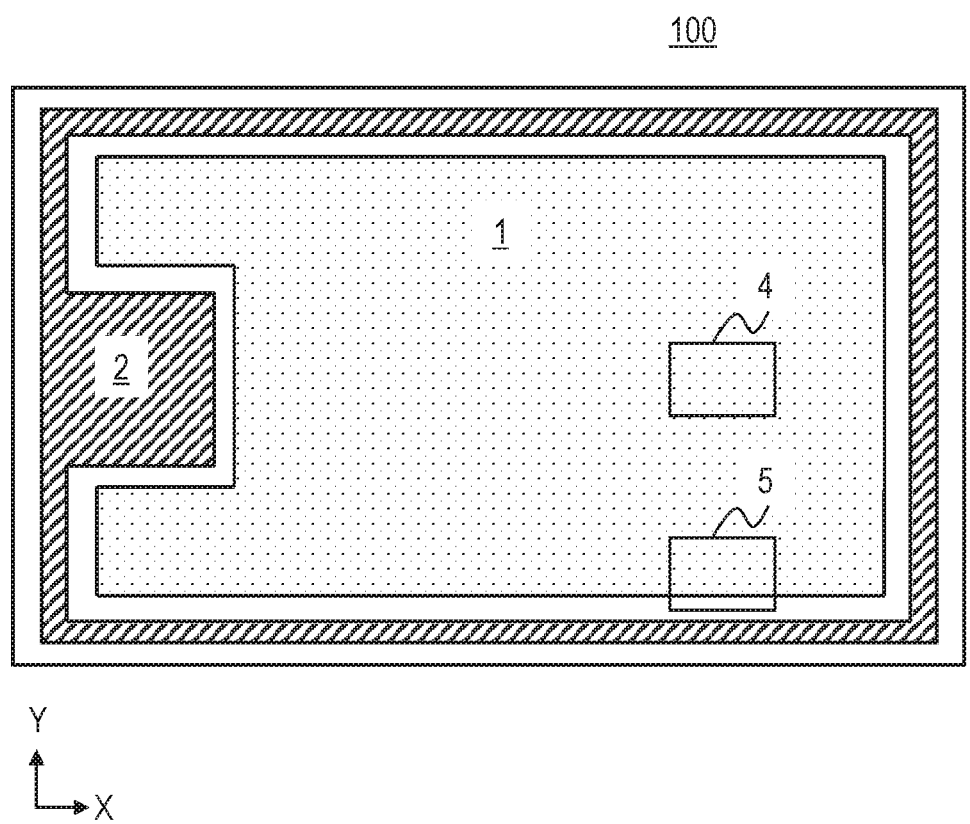
FIG. 1 is a plan view of a semiconductor chip according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a plan view of a semiconductor chip 100 which is a semiconductor device according to the first embodiment.

In FIG. 1, the insulating film is made transparent for simplicity of understanding. As shown in FIG. 1, most of the surface of the semiconductor chip 100 is covered with the emitter electrode 1, and the gate electrode 2 is formed outer periphery of the emitter electrode 1. Further, the collector electrode 3 is formed on the back surface of the semiconductor chip 100. An emitter potential is supplied to the emitter electrode. A gate potential is supplied to the gate electrode 2.

Figure 2A:
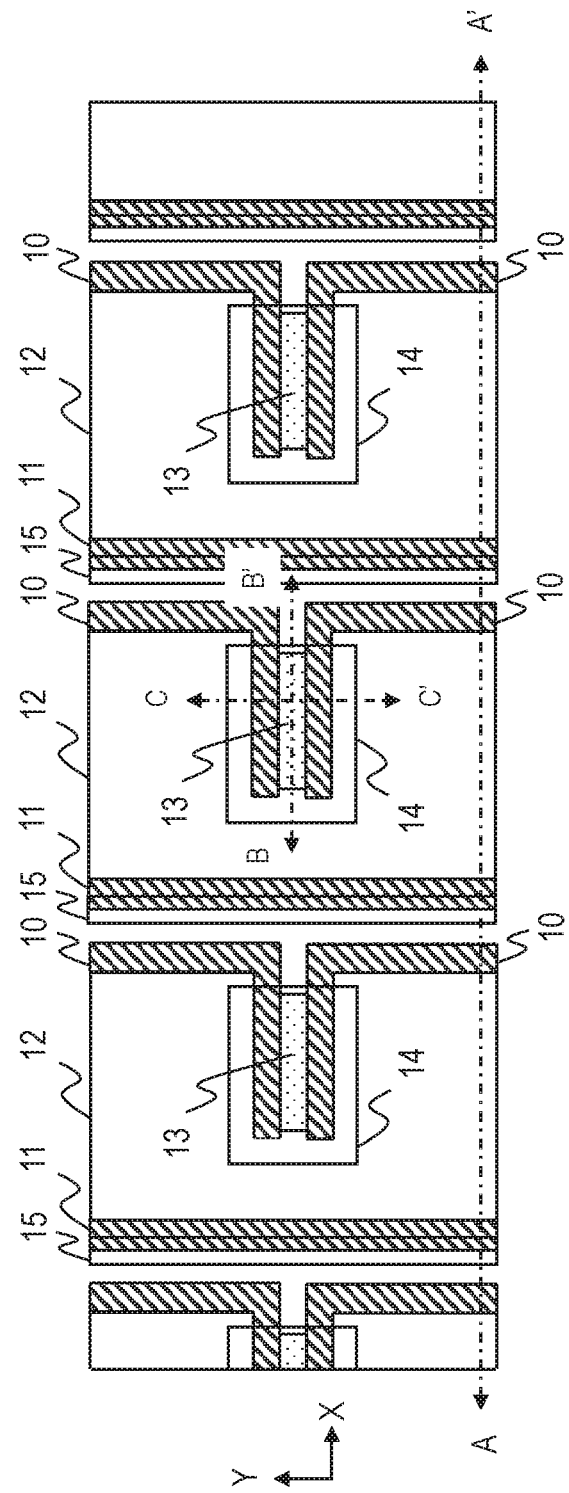
FIG. 2A is a plan view of a semiconductor chip according to the first embodiment.
Figure 2B:
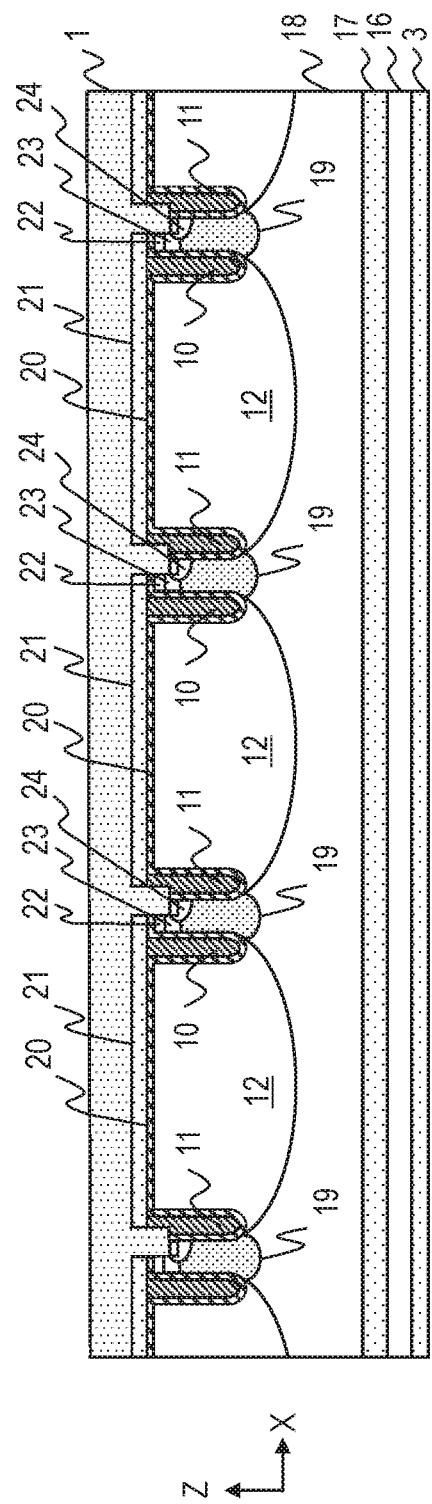
FIG. 2B is cross-sectional view of the semiconductor chip according to the first embodiment.

FIG. 2A is a main portion plan view of the semiconductor chip 100 according to the first embodiment, is an enlarged area 4 of FIG. 1. Incidentally, for clarity, FIG. 2A is shown with the interlayer insulating film permeated. FIG. 2B is a cross-sectional view along A-A' line of FIG. 2A.

The semiconductor chip 100 according to the first embodiment is a GE-S type (GE type shrink structural) IGBT which is a type of IE type IGBT. As shown in FIG. 2A, 2B, the semiconductor chip 100 is formed on semiconductor substrate with an emitter electrode 1, a collector electrode 3, a p+-type collector layer 16, an n+-type field stop layer 17, and an n--type drift layer 18. The semiconductor chip 100 further has a gate potential trench electrode to which the gate potential is supplied (hereinafter referred to as a gate potential trench, or also referred to as a trench gate of the gate potential) 10, an emitter potential trench electrode to which the emitter potential is supplied (hereinafter referred to as an emitter potential trench, or also referred to as a trench gate of the emitter potential) 11. Between the gate potential trench 10 and the emitter potential trench 11, a hole barrier layer 19 of high concentration n+-type is formed. The region formed by the gate potential trench 10, the emitter potential trench 11, the hole barrier layer 19 is an active cell region. Between the two active cell regions, a floating layer 12 (non-active cell region) of p+ (first conductivity type) is formed.

The emitter electrode 1 is coupled to the emitter potential trench 11 via a contact hole. The emitter electrode 1 is coupled to the p+-type body layer 24 through a contact hole and a body contact. Between the gate potential trench 10 and the contact hole of the emitter electrode 1, n+-type emitter layer 22 and p+-type base layer 23 are formed. Incidentally, 15 in FIG. 2A is a body contact Si (Silicon) groove. 20 in FIG. 2B is a gate insulating film, 21 is an interlayer insulating film.

Next, the floating isolation layer and the floating layer control gate (FC-GATE), which are the features of the first embodiment, will be described. As shown in FIG. 2A, the gate potential trench 10 has a shape having a straight portion extending in the Y-axis direction (first direction) and a bent portion extending in the X-axis direction (second direction), in the end speaking L-shape (first shape), as a first trench electrode (first gate potential trench electrode). Furthermore, the gate potential trench 10 has a line-symmetrical shape of the first shape in a line parallel to the X-axis (second shape), as a second trench electrode (second gate potential trench electrode). In the region sandwiched between the first and second shapes of the gate potential trench 10, the floating separation layer 13 is formed. Also, a FC-GATE 14 is formed so as to cover two bent portions of the gate potential trench 10 and the floating isolation layer 13.

Figure 3:
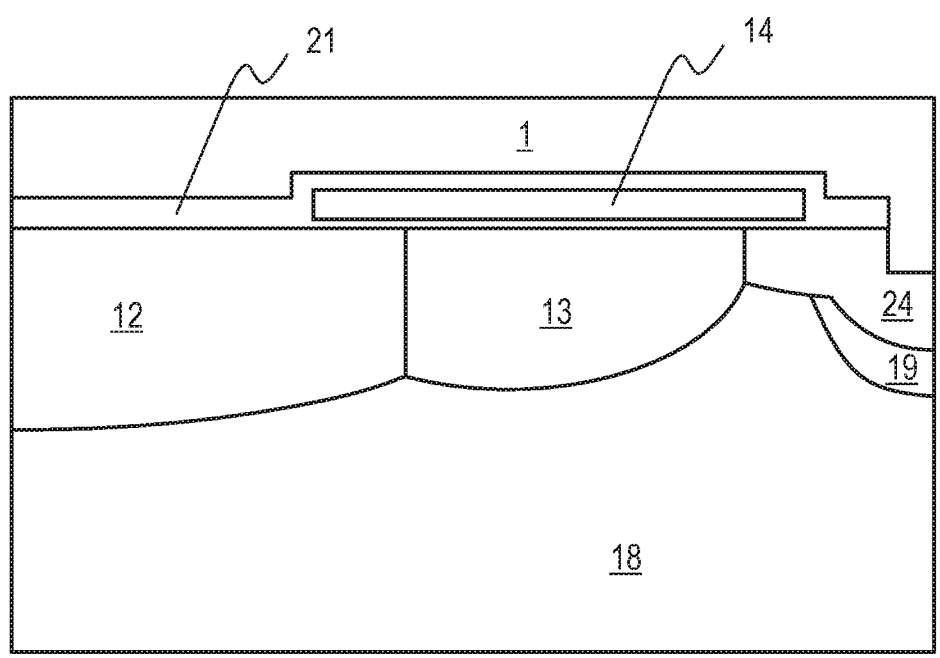
FIG. 3 is a cross-sectional view of a semiconductor chip according to the first embodiment.
Figure 4:
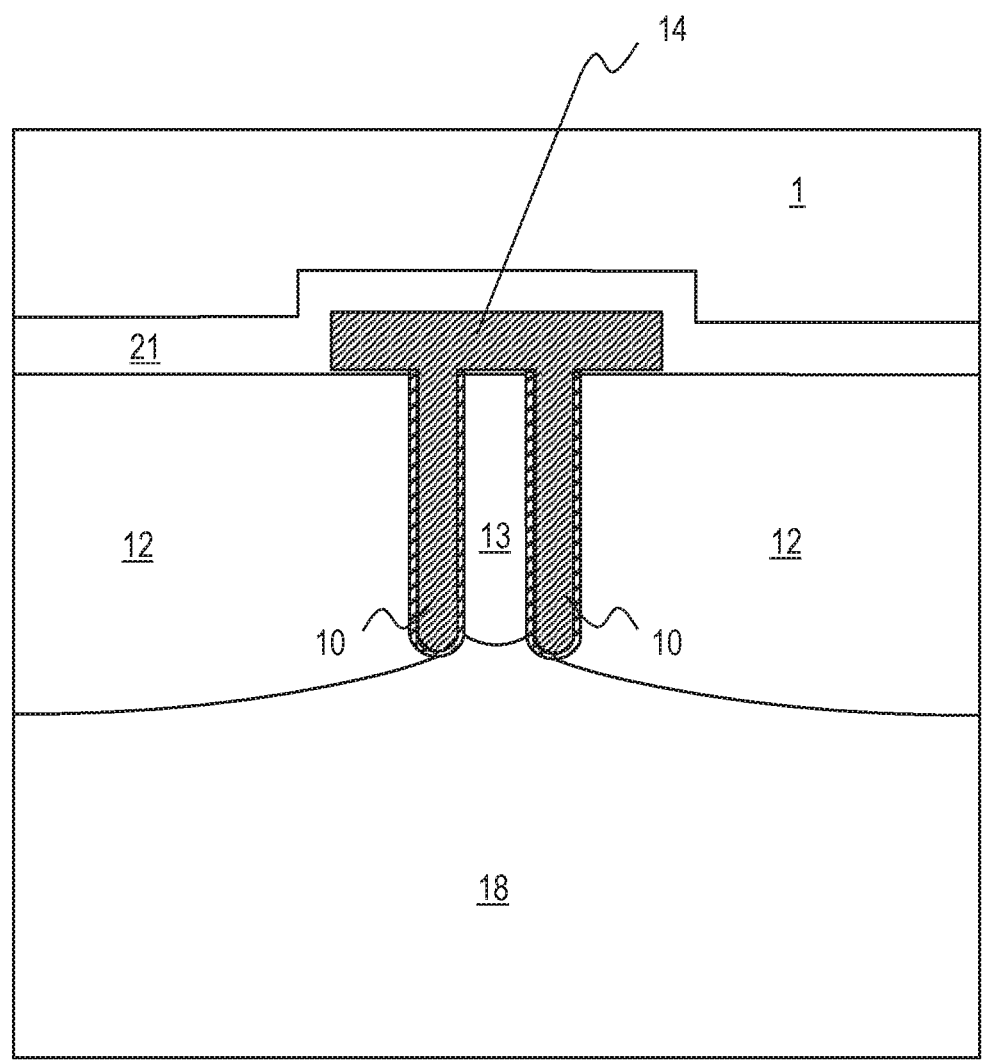
FIG. 4 is a cross-sectional view of a semiconductor chip according to the first embodiment.

FIG. 3 is used to explain in more detail. FIG. 3 is a cross-sectional view along B-B' line of FIG. 2A. FIG. 4 is a cross-sectional view along C-C' line of FIG. 2A. Between the p+-type floating layer 12 and the p+-type body layer 24, a floating isolation layer 13 of n+-type (second conductivity type) is formed. FC-GATE 14 is formed so as to cover the floating isolation layer 13, a part of the floating layer 12, and a part of the body layer 24. FC-GATE 14 is Poly-Si (Polycrystalline Silicon), which is formed at the same time as the gate (Poly-Si) connected to the gate potential trench 10 and is connected to the gate. In order to suppress an increase in the number of manufacturing steps, it is desirable that the floating isolation layer 13 is formed at the same time as the hole barrier layer 19. Alternatively, for adjusting the impurity concentration of the floating isolation layer 13, the floating isolation layer 13 may be formed separately from the hole barrier layer 19.

Next, the operation of the semiconductor chip 100 according to the first embodiment will be described. Incidentally, since the basic operation of IGBT other than the floating layer 12, the floating isolation layer 13 and FC-GATE 14 is the same as the conventional, the basic operation description of IGBT will be omitted. Therefore, here, the floating layer 12, the floating isolation layer 13, and FC-GATE 14 will be described with reference to FIGS. 5 to 7.

Figure 5:
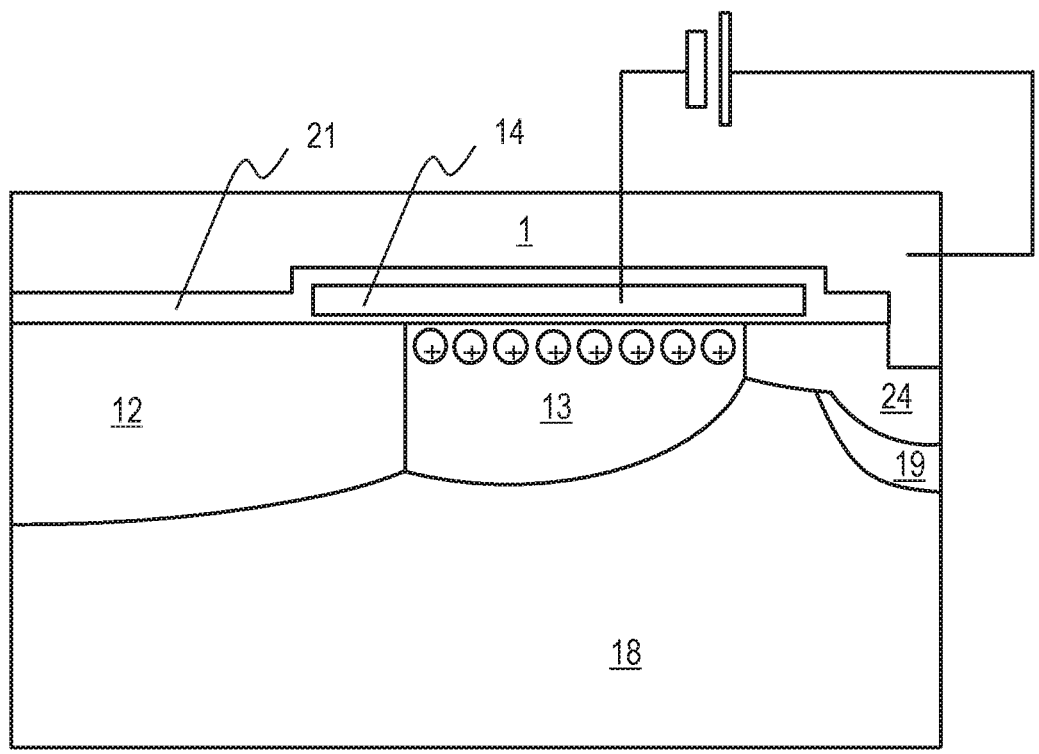
FIG. 5 is a diagram for explaining the operation of the semiconductor chip according to the first embodiment.
Figure 6:
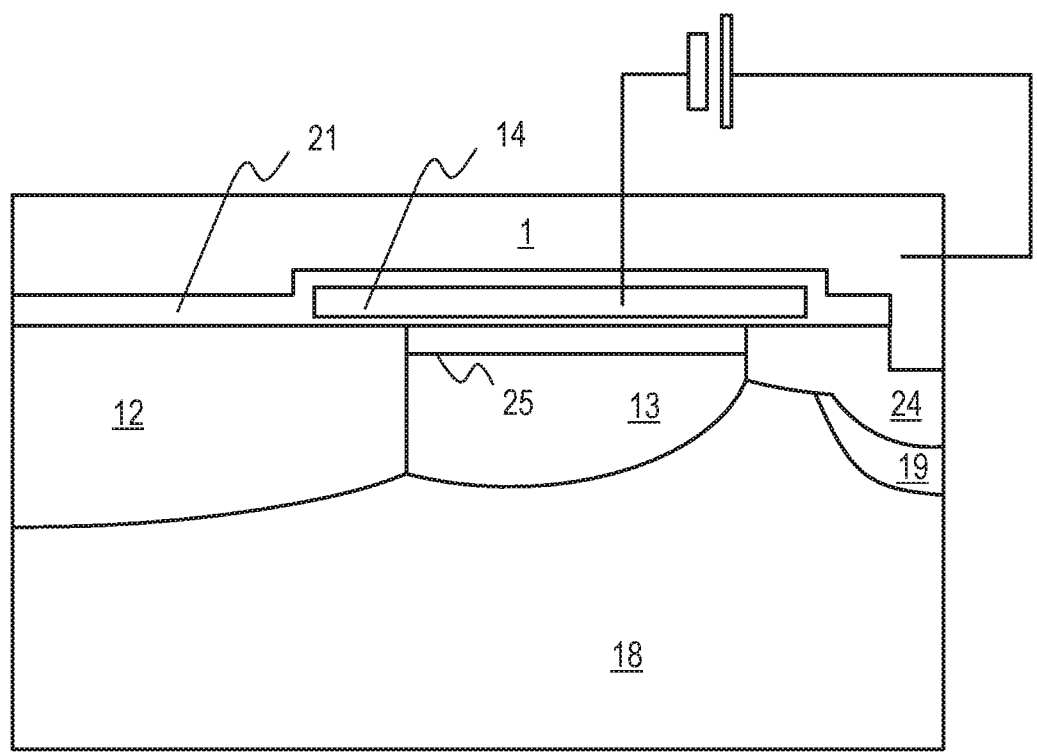
FIG. 6 is a diagram for explaining the operation of the semiconductor chip according to the first embodiment.

FIG. 5 shows when the gate is turned off, i.e. a negative voltage (e.g. −15V) is applied to the gate electrode. When a negative voltage is applied to the gate electrode, a negative voltage is also applied to FC-GATE 14. When a negative voltage is applied to FC-GATE 14, holes in the floating isolation layer 13 are pulled to FC-GATE 14 to create an inversion layer 25 on the surface of the floating isolation layer 13 (FIG. 6). When the inversion layer 25 is formed, the floating layer 12 and the body layer 24 become conductive, and carriers (holes) in the floating layer 12 are discharged to the emitter electrode 1 through the body layer 24. As a result, when turning off the gate, the floating layer 12 is intended to continue to discharge the carrier (hole), the function of suppressing the path by which carrier (hole) is discharged to the emitter electrode (carrier discharge suppressing function) is disabled.

Figure 7:
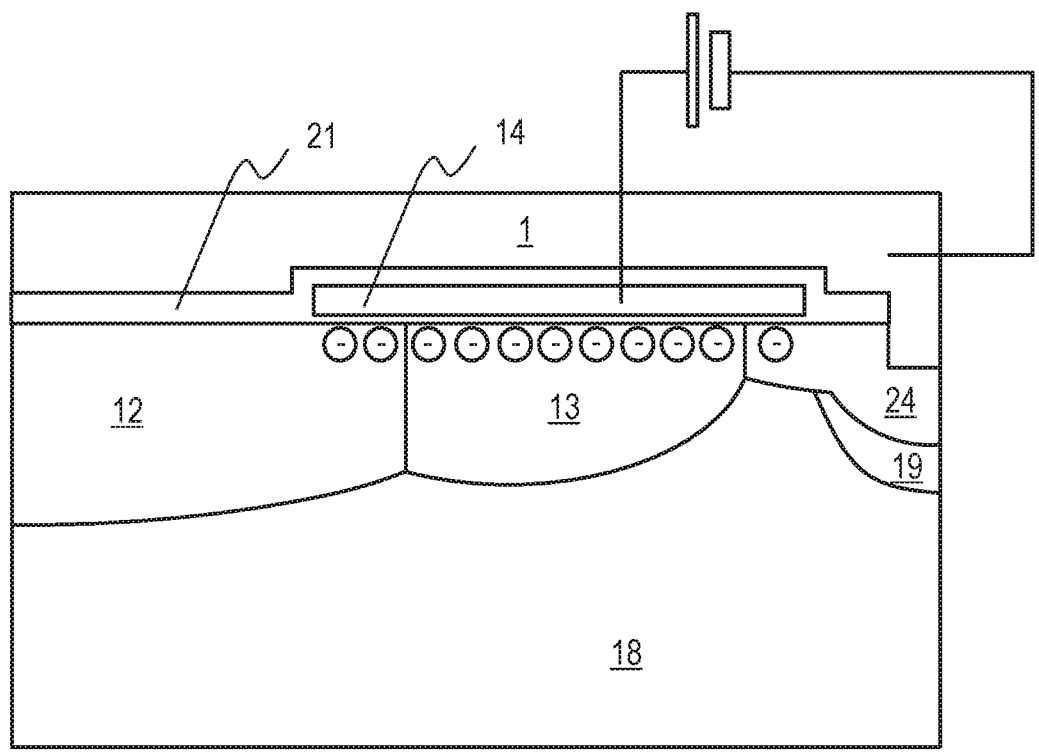
FIG. 7 is a diagram for explaining the operation of the semiconductor chip according to the first embodiment.

Next, the case where the gate is turned on will be described with reference to FIG. 7. When the gate is turned on, a positive voltage (e.g. +15V) is applied to the gate. When a positive voltage is applied to the gate, a positive voltage is also applied to FC-GATE 14. If a positive voltage is applied to FC-GATE 14, no inversion layer 25 is generated. Therefore, the carrier discharge suppressing function of the floating layer 12 functions, and the IE effect can be obtained. Furthermore, when a positive voltage is applied to FC-GATE 14, electrons are attracted to the surface of the floating isolation layer 13. Since the floating layer 12 is further separated from the emitter electrode 1, the IE effect can be further enhanced.

So far, it has been described region 4 of FIG. 1 of the semiconductor chip 100. Here, another region of the semiconductor chip 100 will be described.

Figure 8A:
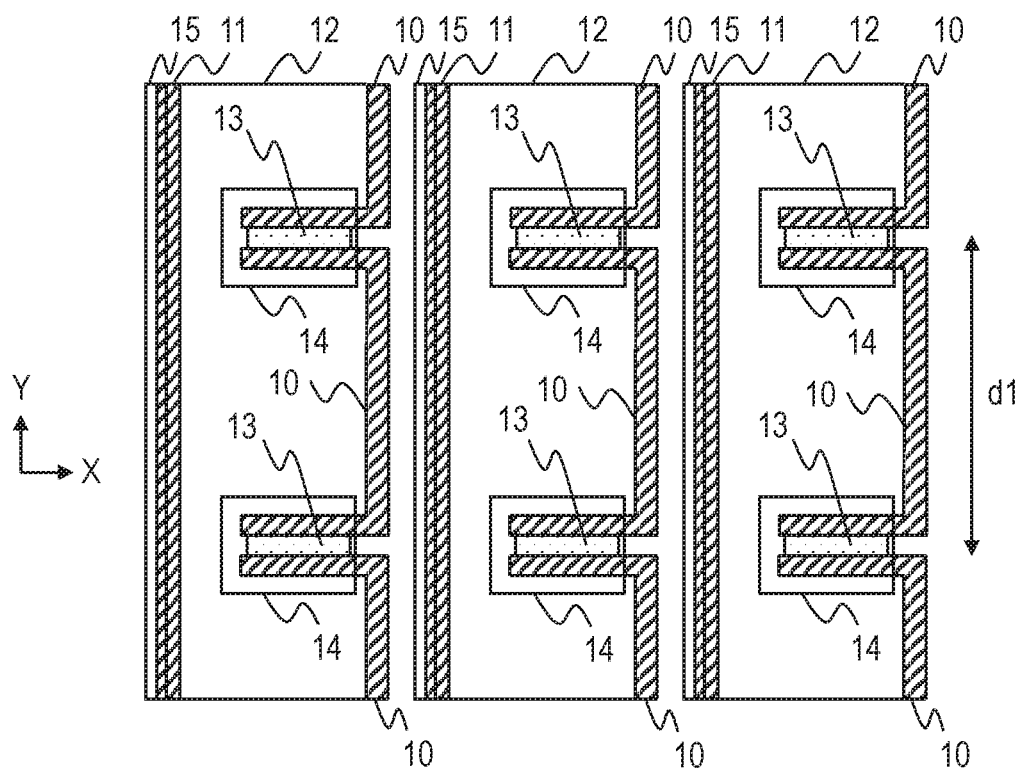
FIG. 8A is a plan view of a semiconductor chip according to the first embodiment.

FIG. 8A is an enlarged view of a region wider than the region 4 in FIG. 1. As shown in FIG. 2A and FIG. 8A, the semiconductor chip 100 is formed with an active cell area and a non-active cell area (floating layer 12) adjacent to the active cell area extending in the Y-axis direction. Then, in the first embodiment, as described above, the gate potential trench 10 is bent in the X-axis direction, the floating isolation layer 13 and FC-GATE 14 are formed. If the portion covered with FC-GATE 14 is referred to as a FC-GATE region, a plurality of FC-GATE regions is arranged. For example, as shown in the drawing 8A, FC-GATE regions are arranged at intervals of d1 in the Y-axis direction.

Here, the active cell region and the termination region will be described. The outside of the active cell region (peripheral portion of the semiconductor chip 100), p+-type cell peripheral junction region and the termination region so as to surround the active cell region (both not shown) are disposed. These regions (referred to as the termination region) are non-active cell regions and there is no hole discharge path, so that the current is concentrated in the region adjacent to the termination region in the active cell region, which may cause element breakdown and the like. Therefore, in the first embodiment, in order to alleviate the current concentration, the arrangement density of FC-GATE 14 in the region adjacent to the termination region in the active cell region is increased.

Figure 8B:
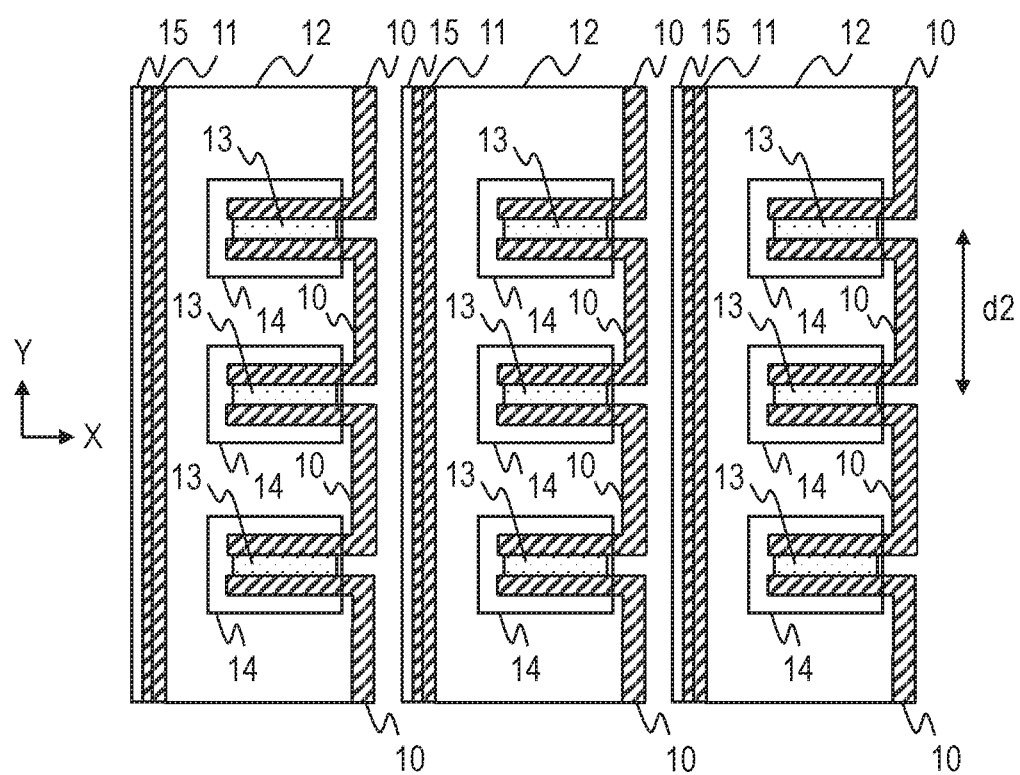
FIG. 8B is a plan view of a semiconductor chip according to the first embodiment.

FIG. 8B is an enlarged view of region 5 of FIG. 1, the active cell region adjoining the termination region. As shown in the drawing 8B, FC-GATE regions are arranged at intervals of d2 in the Y-axis direction. Where d2<d1. That is, FC-GATE 14 arrangement density of the active cell region adjacent to the termination region of the semiconductor chip 100>the arrangement density of FC-GATE 14 of the active cell region at the center of the semiconductor chip 100.

As described above, in the semiconductor chip 100 according to the first embodiment, the floating isolation layer 13 is provided between the floating layer 12 and the body layer 24. In addition, a FC-GATE 14 is provided above the floating layer, so that whether or not the floating layer 12 functions can be controlled. As a result, it is possible to achieve both the improvement of the IE effect and the reduction of the switching loss (Eoff) at the time of turn-off.

Figure 9:
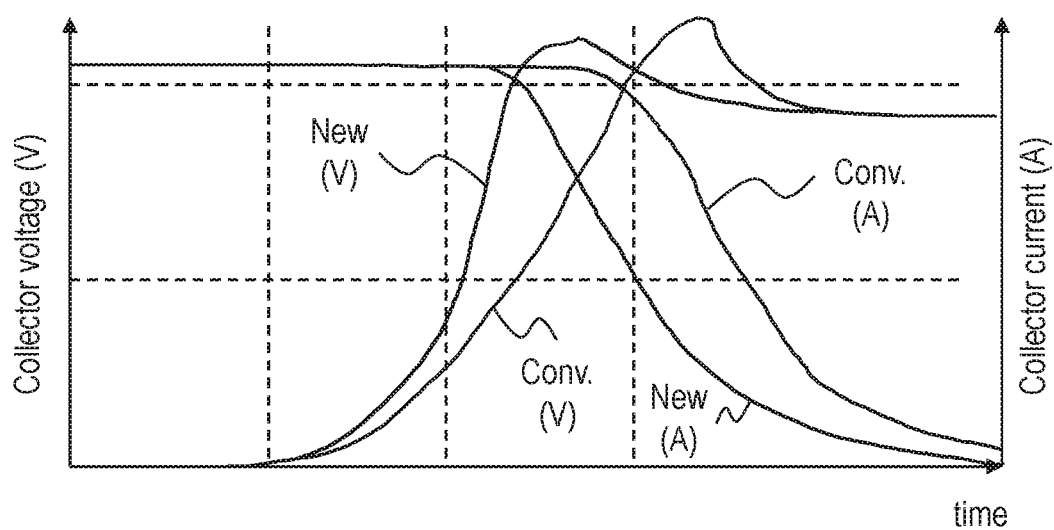
FIG. 9 is a graph for explaining the effects of the semiconductor chip according to the first embodiment.

Here, this effect will be explained by simulation results. FIG. 9 shows the collector voltages and collector currents when the gate of IGBT is turned off. New(V) represents the collector voltage in IGBT where the first embodiment is applied. New(A) shows the collector current in IGBT where the first embodiment is applied. Conv.(V) shows the collector-voltage of a conventional IGBT. Conv.(A) shows the collector current of a conventional IGBT. As shown in FIG. 9, it can be seen that New(V) rises earlier than Conv.(V) and New(A) falls earlier than Conv.(A). That is, it is understood that the turn-off speed is increased.

First Modified Example

Figure 10A:
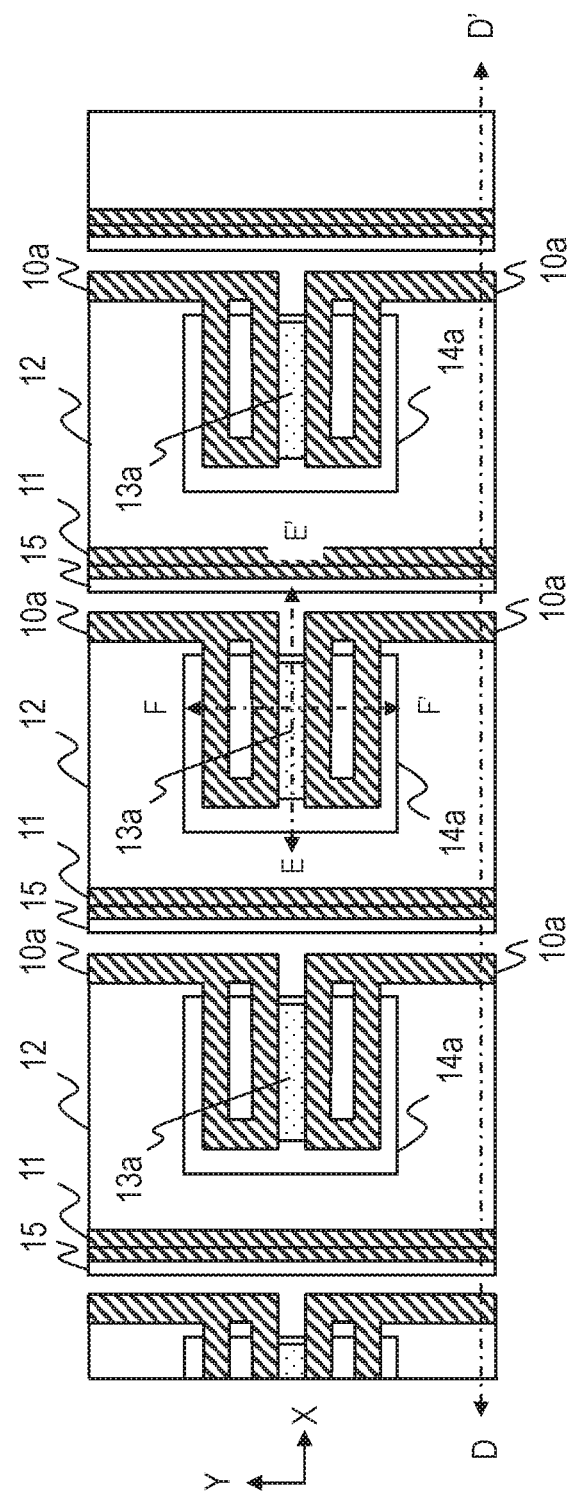
FIG. 10A is a plan view of a semiconductor chip according to a first modified example of the first embodiment.
Figure 10B:
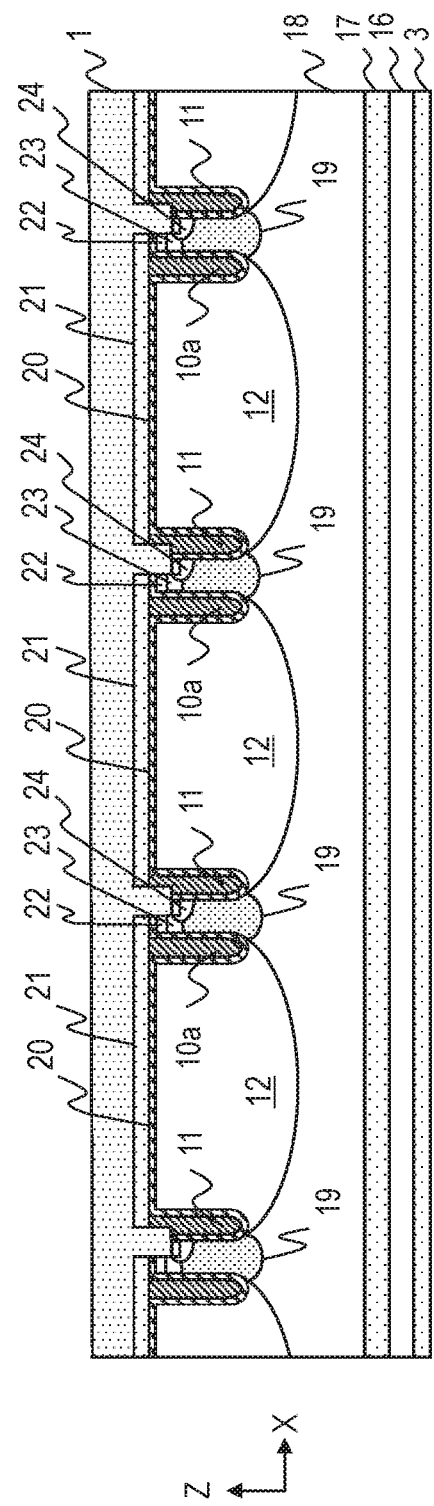
FIG. 10B is a cross-sectional view of a semiconductor chip according to the first modified example of the first embodiment.

FIG. 10A is a main portion plan view of a semiconductor chip according to a first modified example of the first embodiment, and is enlarged the region 4 of FIG. 1. FIG. 10B is a cross-sectional view along D-D' line of FIG. 10A.

A difference from the first embodiment is in the form of a gate-potential trench 10a. As shown in FIG. 10A, the gate potential trench 10a of the first modified example has a shape having a straight portion extending in the Y-axis direction and a U-shaped bent portion extending in the X-axis direction, shortly a P-shape (third shape), as a first trench electrode (first gate potential trench electrode). The P-shape is bent in the X-axis direction from a first point of the straight portion, further bent in the Y-axis direction, further bent in the X-axis direction, a shape returning to the second point of the straight portion. Furthermore, the gate potential trench 10a has a line-symmetrical shape of the first shape in a line parallel to the X-axis (fourth shape), as a second trench electrode (second gate potential trench electrode). In the region sandwiched between the third and fourth shapes of the gate potential trench 10a, the floating isolation layer 13a is formed. Also, a FC-GATE 14a is formed so as to cover two bent portions of the gate potential trench 10a and the floating isolation layer 13a.

Figure 11:
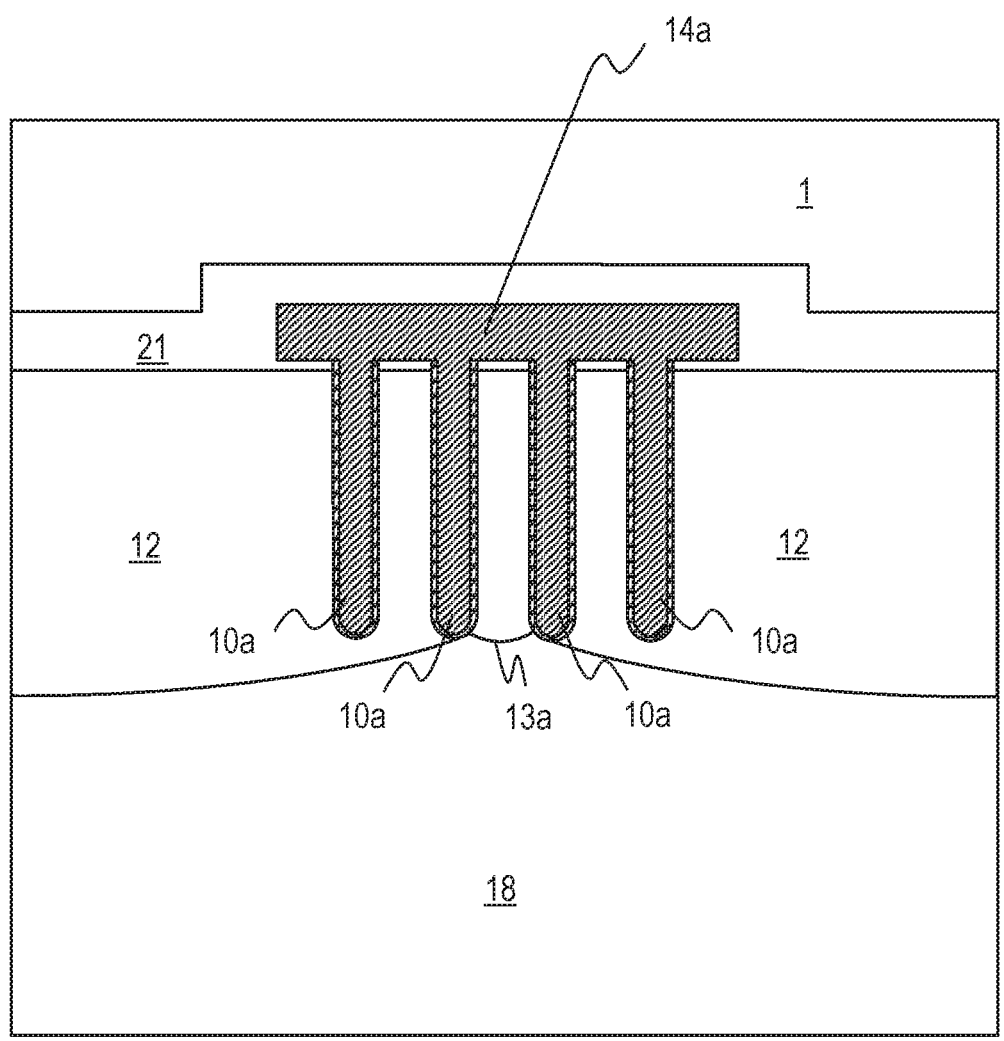
FIG. 11 is a cross-sectional view of a semiconductor chip according to the first modified example of the first embodiment.

Cross-sectional view along E-E' of FIG. 10A is similar to that of FIG. 3. FIG. 11 is a cross-sectional view along F-F' line of FIG. 10A. An n+-type floating isolation layer 13a is formed between the p+-type floating layer 12 and the p+-type body layer 24. FC-GATE 14a is formed so as to cover the floating isolation layer 13a, a part of the floating layer 12, and a part of the body layer 24. FC-GATE 14a is a Poly-Si, is formed simultaneously with Poly-Si of the gate potential trench 10a, and is connected to the gate electrode. In order to suppress an increase in the number of manufacturing steps, it is desirable that the floating isolation layer 13a is formed at the same time as the hole barrier layer 19. Alternatively, in order to adjust the impurity concentration of the floating isolation layer 13a, the floating isolation layer 13a may be formed separately from the hole barrier layer 19.

The operation of the semiconductor chip according to the first modified example is the same as that of the first embodiment, and therefore the explanation thereof is omitted.

As described above, the semiconductor chip according to the first modified example, similarly to the first embodiment, it is possible to achieve both IE-effect improvement and switching loss (Eoff) reduce at turn-off.

Furthermore, in the semiconductor chip according to the first modified example, as compared with the semiconductor chip 100, since the number of trenches extending in the X-axis direction is increased, it is possible to exert an electric field relaxation effect on the trench. A high electric field is generated at the bottom of the trench due to the construction of IGBT. By increasing the number of trenches, it is possible to alleviate the electric field applied per one trench. As a secondary effect, the hole discharge effect can be enhanced. Hot holes are created when a high electric field is applied to the trench bottom. Hot holes adversely affect trenches and adversely affect gate reliability. When the high electric field to the trench is relaxed, the adverse effects of hot holes can be reduced.

Second Modified Example

Figure 12:
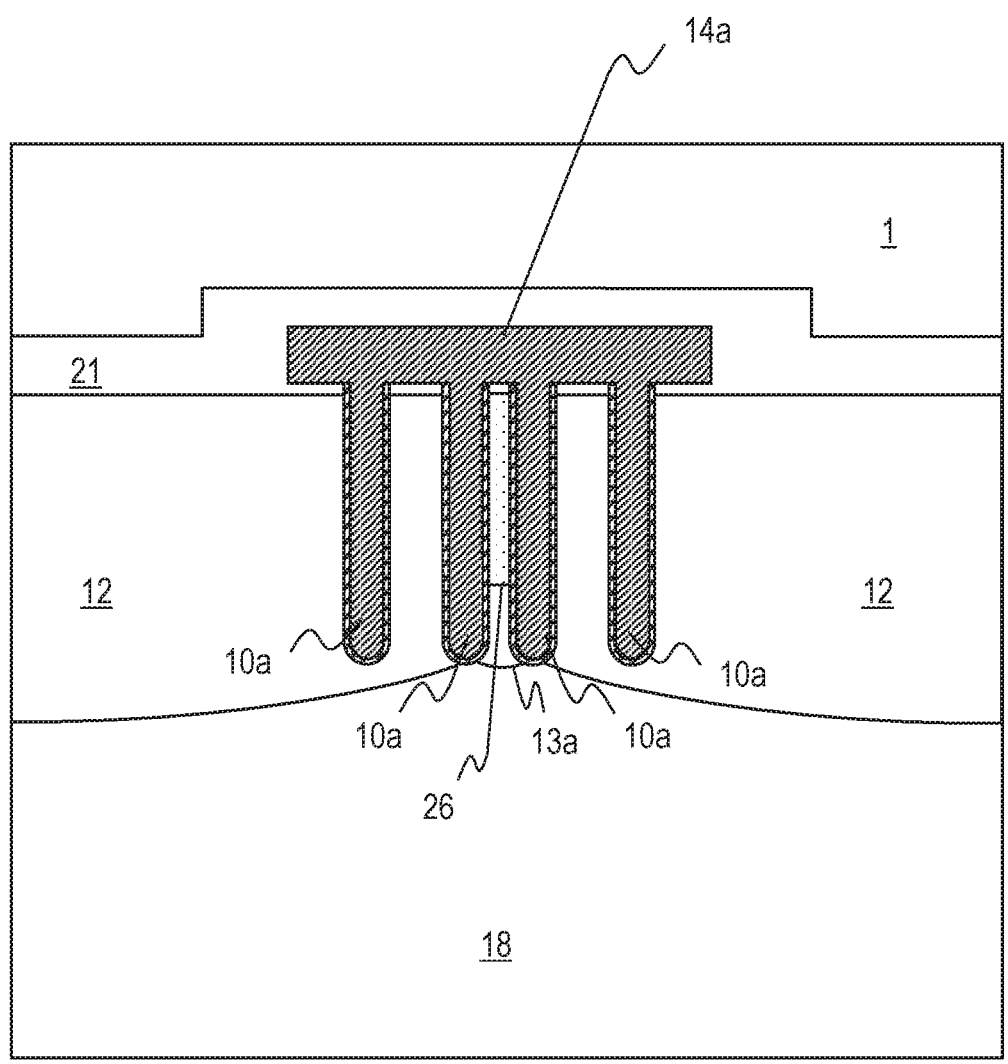
FIG. 12 is a cross-sectional view of a semiconductor chip according to a second modified example of the first embodiment.

FIG. 12 is a cross-sectional view of a main portion of a semiconductor chip according to a second modified example of the first embodiment. This second modified example is based on the first modified example.

A difference from the first modified example is the gate potential trench 10a and the p+-type diffusing layer 26. In the second modified example, the interval of the two gate potential trenches 10a in contact with the floating separating layer 13a is narrowed compared to FIG. 10 (narrowed mesa width). In another expression, the distance between the two gate potential trenches 10a in contact with the floating isolation layer 13a is narrower than the distance between the gate potential trench 10a in contact with the floating isolation layer 13a and the gate potential trench 10a not in contact with the floating isolation layer 13a. That is, the distance between the bent portion of the first gate potential trench electrode and the bent portion of the second gate potential trench electrode is shorter than the distance of the first point and the second point of the straight portion. A p+-type diffusion layer 26 is formed on the floating isolation layer 13a.

A basic operation of the semiconductor chip according to the second modified example is the same as that of first modified example, but the voltage applied to FC-GATE differs. First, the case of turning off the gate will be described. Because the p+-type diffusion layer 26 is formed between the two gate potential trenches 10a, even without applying a negative voltage (−15V) to FC-GATE 14a, the floating layer 12 (p+-type), the floating isolation layer (p+-type), the body layer 24 (p+-type) will be conductive (normally on). Therefore, the gate-off voltage, for example, even in a 0V, carriers (holes) are discharged from the floating layer 12 to the emitter electrode 1.

Next, the case where the gate is turned on will be described. There is a p+-type diffusion layer 26 between the two gate potential trenches 10a. Since the interval of the two gate potential trenches 10a is narrowed, the diffusion layer 26 is easily depleted. Therefore, by applying a positive voltage to the gate electrode (e.g., +15V), depletion layer is formed in the diffusion layer 26, and no conduction between the floating layer 12 and the body layer 24 is formed. Therefore, the carrier discharge suppressing function of the floating layer 12 functions.

As described above, in the semiconductor chip according to the second modified example, in addition to the effect of first modified example, there is an effect that a negative voltage is not required when the gate is turned off. For example, the second modified example is effective for IGBT that are gate-driven at 0-15V. Although the second modified example has been described based on the first modified example, it is also applicable to the first embodiment.

Third Modified Example

Figure 13:
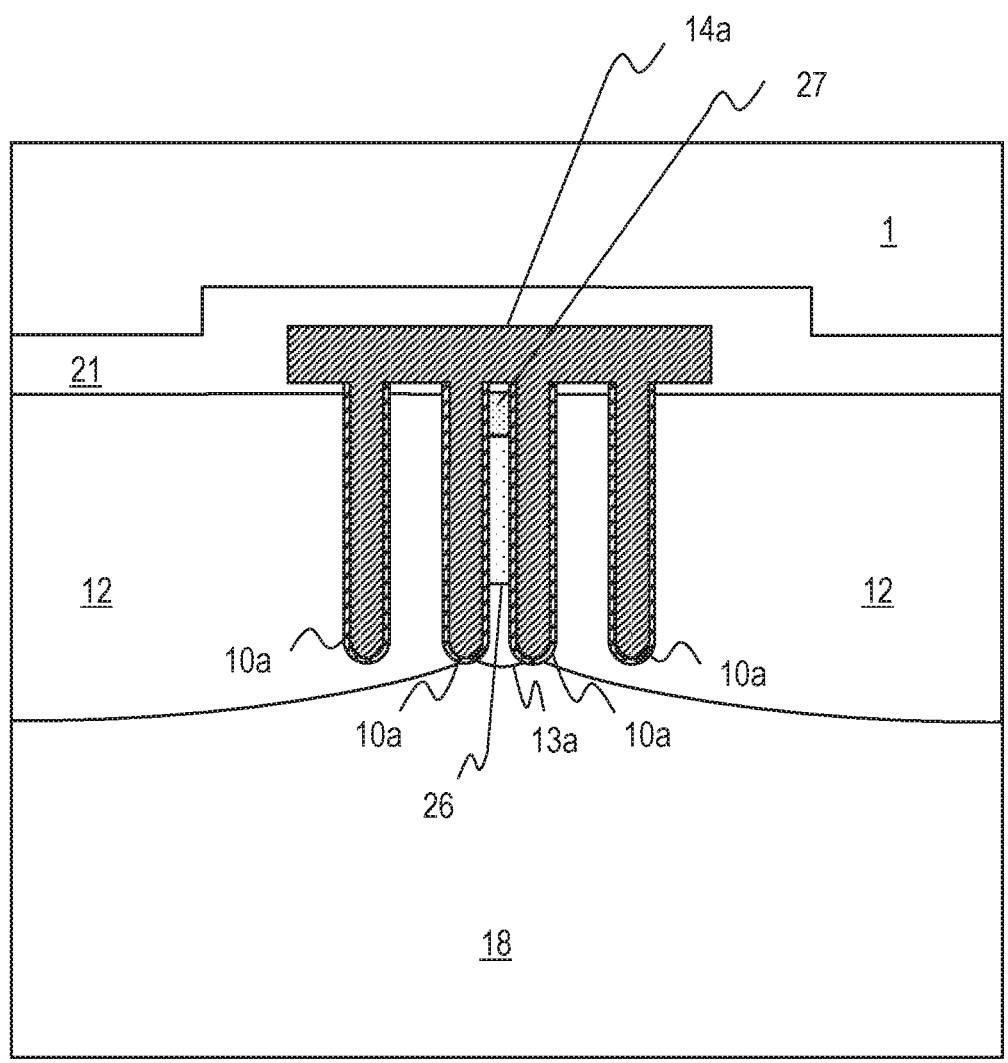
FIG. 13 is a cross-sectional view of a semiconductor chip according to a third modified example of the first embodiment.

FIG. 13 is a main portion cross-sectional view of a semiconductor chip according to a third modified example of the first embodiment. This third modified example is based on the second modified example.

A difference from the second modified example is that an n+-type diffuser 27 is added. In this third modified example, an n+-type diffusion layer 27 is formed on the p+-type diffusion layer 26. When the p+-type diffusion layer 26 is formed as in the second modified example, the p concentration of the surface of the diffusion layer 26 tends to increase depending on processes. If the p concentration on the surface of the diffusion layer 26 becomes higher than expected, depletion is less likely to occur. Therefore, in the present third modified example, the n+-type diffusion layer 27 is formed on the diffusion layer 26 to cancel this phenomenon.

In this third modified example, the same effects as in second modified example can be achieved. Furthermore, since the n+-type (diffusion layer 27 and the floating isolation layer 13a) is formed above and below the p+-type diffusion layer 26, depletion is promoted from above and below when the hole current passes. As a result, the ability to isolate the floating layer 12 is improved. Further, as described above, since it is more easily depleted than the second modified example, the distance between the two gate potential trenches 10a can be wider than the second modified example.

Fourth Modified Example

Figure 14:
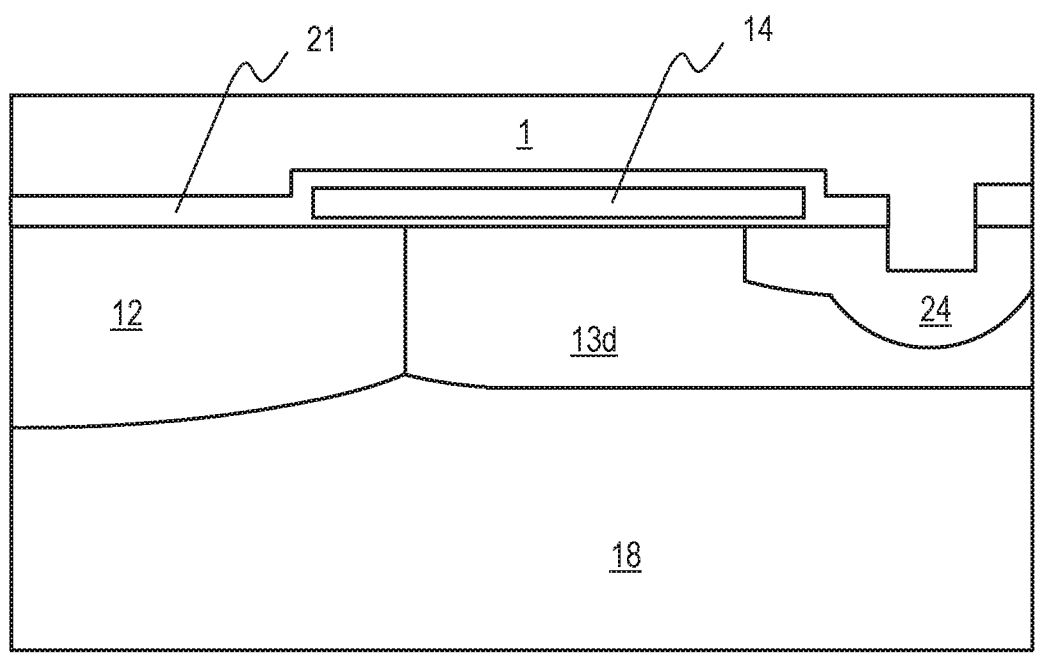
FIG. 14 is a cross-sectional view of a semiconductor chip according to a fourth modified example of the first embodiment.

FIG. 14 is a main portion cross-sectional view of a semiconductor chip according to a fourth modified example of the first embodiment. FIG. 14 is a cross-sectional view along B-B' line of FIG. 2A.

A difference from the first embodiment is the floating isolation layers 13d. As shown in FIG. 14, the floating isolation layer 13d of the fourth modified example is formed in the entire area of the lower layer of the body layer 24. As compared with the first embodiment (FIG. 3), the discharge of carriers (holes) from the body layers 24 can be further suppressed.

The semiconductor chip according to the fourth modified example can further improve the IE effect than first embodiment semiconductor chip.

Second Embodiment

Figure 15A:
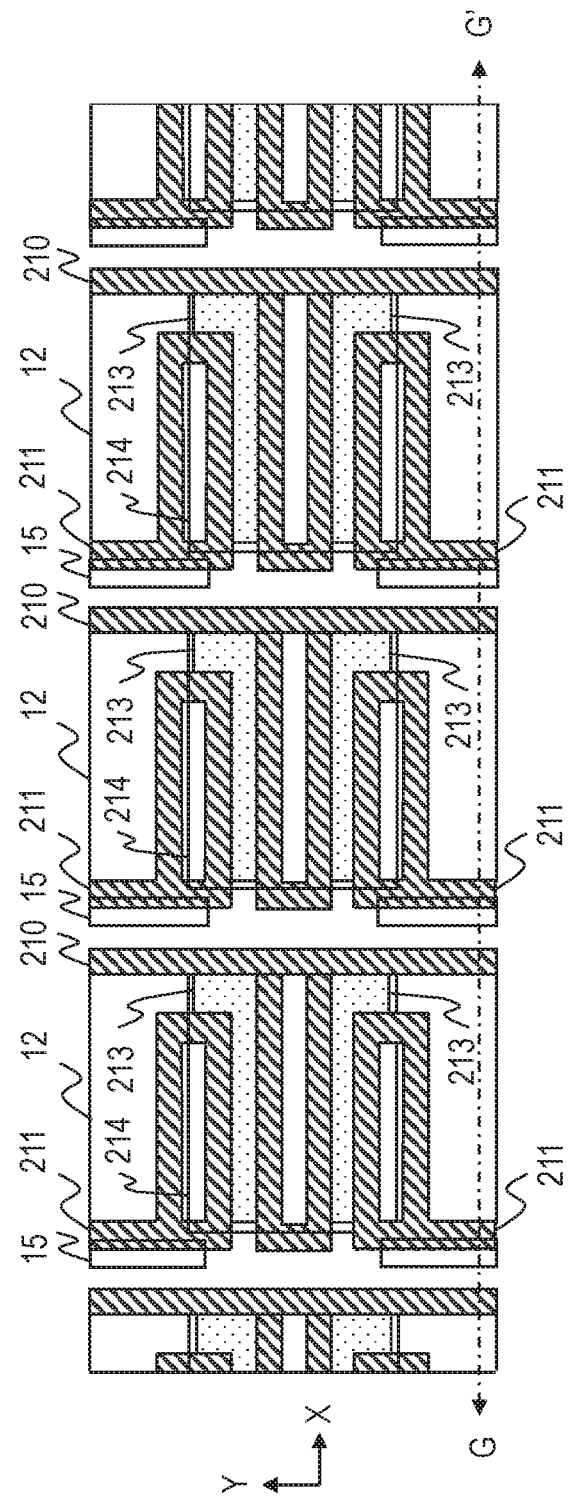
FIG. 15A is a plan view of a semiconductor chip according to a second embodiment.
Figure 15B:
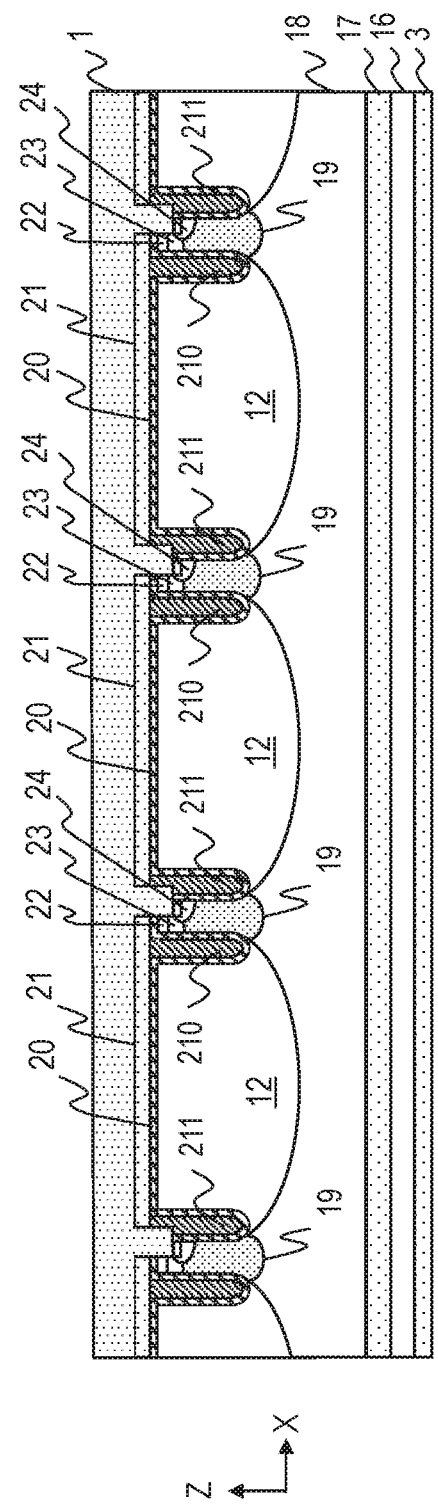
FIG. 15B is a cross-sectional view of a semiconductor chip according to the second embodiment.

FIG. 15A is a main portion plan view of a semiconductor chip according to a second embodiment, and is enlarged view of the region 4 in FIG. 1. FIG. 15B is a cross-sectional view along G-G' line of FIG. 15A.

Differences from first embodiment are in the form of a gate potential trench 210, an emitter potential trench 211, a floating isolation layer 213, and a FC-GATE 214. As shown in FIG. 15A, the gate potential trench 210 has a shape (fifth shape) with a straight portion extending in the Y-axis direction and a U-shaped bent portion extending in the X-axis direction. Emitter potential trench 211 has a shape having a straight portion extending in the Y-axis direction and a U-shaped bent portion extending in the X-axis direction, shortly P-shape (sixth shape), as a first trench electrode (first emitter potential trench electrode). The P-shape is bent in the X-axis direction from a first point of the straight portion, further bent in the Y-axis direction, further bent in the X-axis direction, a shape returning to a second point of the straight portion. Furthermore, the emitter potential trench 211 has a line-symmetrical shape of the sixth shape in a line parallel to the X-axis (seventh shape), as a second trench electrode (second emitter potential trench electrode). The fifth shape is disposed between the sixth and seventh shapes.

A floating isolation layer 213 is formed in a region sandwiched between the fifth shape and the sixth shape. A floating isolation layer 213 is also formed in a region sandwiched between the fifth shape and the seventh shape. FC-GATE 214 is formed so as to cover the bent portion of the gate potential trench 210 and the floating isolation layer 213.

The operation of the semiconductor chip according to the second embodiment is the same as first embodiment, but the discharge path of the carrier (hole) differs. In this second embodiment, the carriers are discharged through the floating layer 12, the floating isolation layer 213, the body layer 24 formed on the emitter potential trench 211, and the emitter electrode 1 in this order.

As described above, in the semiconductor chip according to the second embodiment, similarly to first embodiment, it is possible to achieve both IE-effect improvement and switching loss (Eoff) reduce at turn-off. Further, the second embodiment is advantageous in that the gate capacitance can be reduced. For example, in the first modified example, as described above, the gate potential trench 10a has the third and fourth shapes. The third and fourth shapes are factors that increase the gate capacitance for the gate potential trench 10a. On the other hand, in the second embodiment, only the fifth shape contributes to the gate capacitance. Therefore, when compared to the first modified example, the gate capacitance of the second embodiment is reduced. A small gate capacitance leads to a faster switching speed of IGBT.

Fifth Modified Example

Figure 16A:
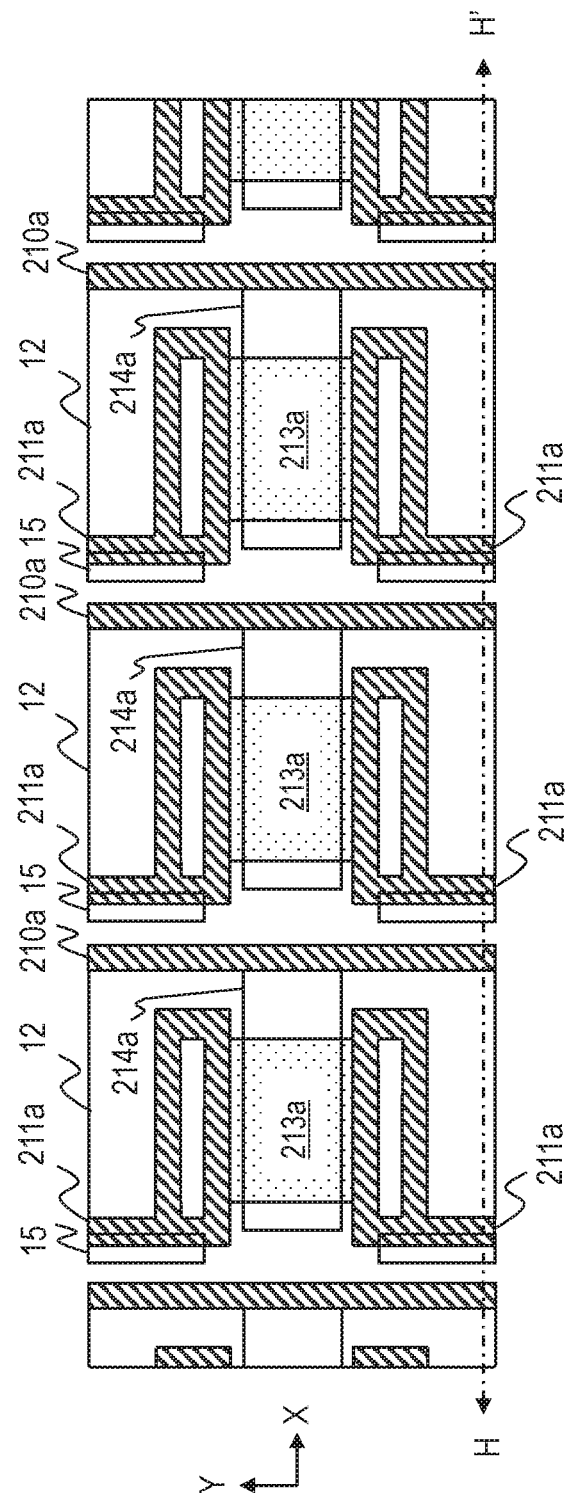
FIG. 16A is a plan view of a semiconductor chip according to a fifth modified example of the second embodiment.
Figure 16B:
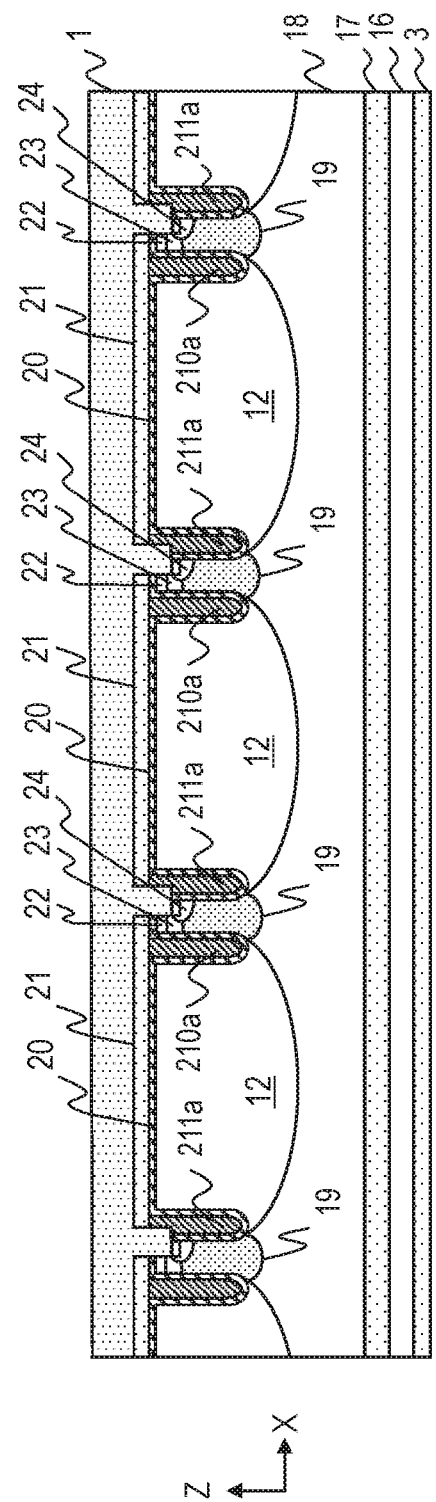
FIG. 16B is a cross-sectional view of a semiconductor chip according to the fifth modified example of the second embodiment.

FIG. 16A is a main portion plan view of a semiconductor chip according to a fifth modified example of the second embodiment, and is enlarged view of the region 4 in FIG. 1. FIG. 16B is a cross-sectional view along H-H' of FIG. 16A.

The difference from the second embodiment is the shapes of the gate potential trench 210a, the floating isolation layer 213a, and FC-GATE 214a. As shown in FIG. 16A, the gate potential trench 210a is formed of a straight-line portion extending in the Y-axis direction, and does not have a U-shaped bent portion of the second embodiment. Similar to the second embodiment, the emitter potential trench 211a forms the first trench electrode (first emitter potential trench electrode) and the second trench electrode (second emitter potential trench electrode) having the sixth and seventh shapes.

A floating isolation layer 213a is formed in a region sandwiched between the sixth and seventh shapes of the emitter potential trench 211a. FC-GATE 214a is formed so as to cover the floating isolation layer 213a.

The operation of the semiconductor chip according to the fifth modified example is the same as that of second embodiment semiconductor chip. The carrier (hole) discharge path is formed by the floating layer 12, the floating isolation layer 213a, the body layer 24 formed on the emitter potential trench 211 side, and the emitter electrode 1 in this order.

As described above, the semiconductor chip according to the fifth modified example can achieve the same effects as those of second embodiment semiconductor chip. In addition, since the gate potential trench 210a does not have a bent portion in the X-axis direction, the gate-emitter capacitance can be reduced, and the switching speed of IGBT can be increased.

Sixth Modified Example

Figure 17A:
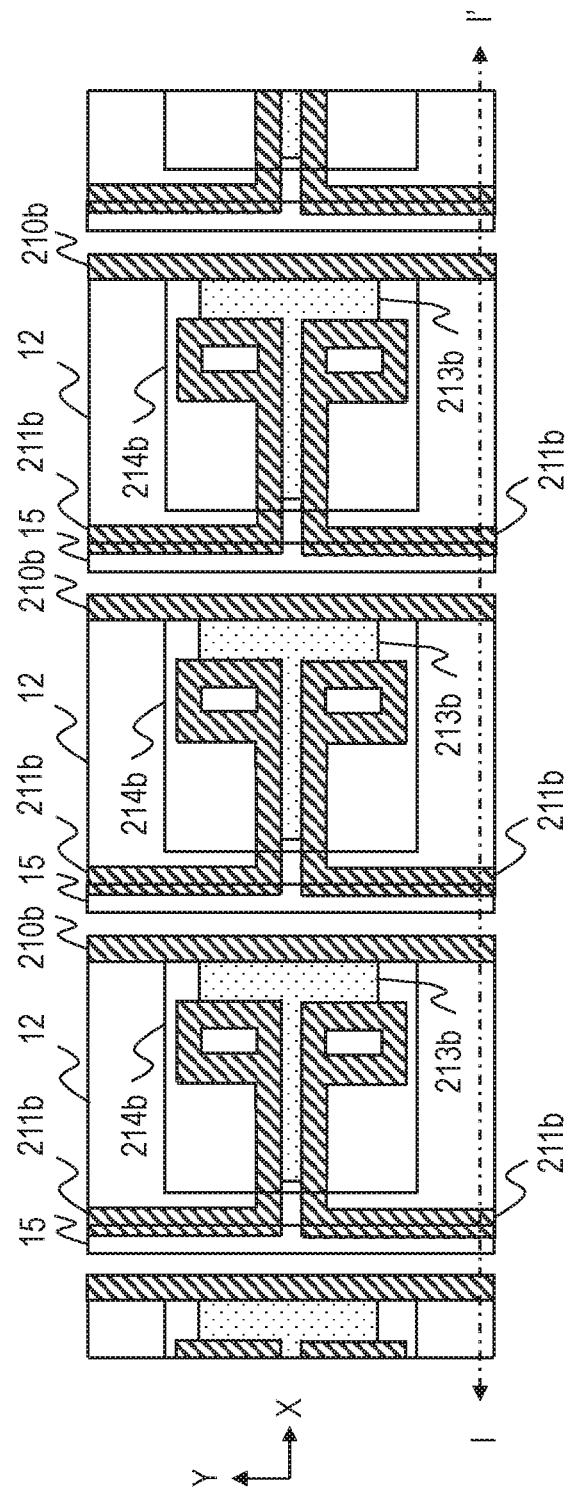
FIG. 17A is a plan view of a semiconductor chip according to a sixth modified example of the second embodiment.

FIG. 17A is a main portion plan view of a semiconductor chip according to a sixth modified example of the second embodiment, and is enlarged view of the region 4 in FIG. 1. FIG. 17B is a cross-sectional view along I-I' of FIG. 17A.

Differences from the fifth modified example are in the form of an emitter potential trench 211b, a floating isolation layer 213b, and a FC-GATE 214b. As shown in FIG. 17A, the emitter potential trench 211b has a shape having a straight portion extending in the Y-axis direction and a P-shaped bent portion extending in the X-axis direction (eighth shape), as a first trench electrode (first emitter potential trench electrode). The P-shape is bent in the X-axis direction from the straight portion, further bent in the Y-axis direction from a first point of the bent portion, further bent in the X-axis direction, a shape returning to a second point of the bent portion. Furthermore, the emitter potential trench 211b has a line-symmetrical shape of the eighth shape in a line parallel to the X-axis (ninth shape), as a second trench electrode (second emitter potential trench electrode).

The floating isolation layer 213b is formed in a region sandwiched between the eighth shape and the ninth shape. FC-GATE 214b is formed to cover the bent portions of the emitter-potential trenches 211b and the floating isolation layers 214b.

The operation of the semiconductor chip according to the sixth modified example is the same as that of second embodiment semiconductor chip. The carrier (hole) is discharged through the floating layer 12, the floating isolation layer 213b, the body layer 24 formed on the emitter potential trench 211 side and the emitter electrode 1.

As described above, the semiconductor chip according to the sixth modified example can achieve the same effects as the semiconductor chip of the second embodiment.

Third Embodiment

Figure 18:
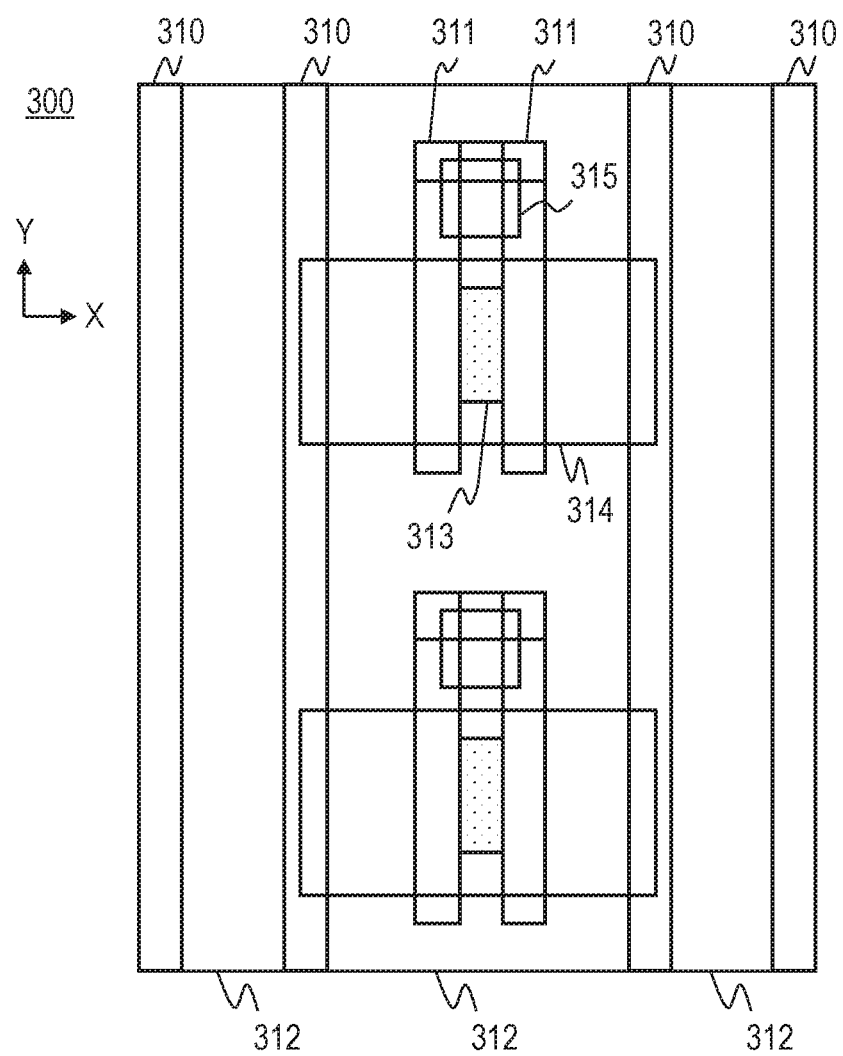
FIG. 18 is a plan view of a semiconductor chip according to a third embodiment.

FIG. 18 is a plan view of a semiconductor chip 300 according to a third embodiment. Although IGBT of GE-S type has been described in the first and second embodiments, FIG. 18 shows IGBT of GGEE type.

As shown in FIG. 18, the semiconductor chip 300 has a gate potential trench 310 extending in Y-axis, an emitter potential trench 311, a floating layer 312 of the first conductivity type, a floating isolation layer 313 of the second conductivity type, FC-GATE 314, and contacts 315 for providing emitter potential to the emitter potential trench 311.

The feature of the third embodiment is in FC-GATE 314 with the floating isolation layer 313, as also described in the first and second embodiments. Here, it will be described specifically floating isolation layer 313 and FC-GATE 314.

The floating isolation layer 313 is formed in a region sandwiched between the two emitter potential trenches 311. That is, the floating isolation layer 313 is formed between the first emitter potential trench electrode as the first trench electrode and the second emitter potential trench electrode as the second trench electrode. FC-GATE 314 is formed to cover the floating isolation layers 313. Incidentally, FC-GATE 314 is connected to the gate to supply the gate potential, similarly to first and second embodiments.

The operation of the semiconductor chip 300 according to the third embodiment is the same as the first and second embodiments, but the discharge path of the carrier (hole) differs. In the third embodiment, carriers are discharged to the emitter electrode 1 through the floating layer 312, the floating isolation layer 313, the body layer (not shown), and the contact 315.

As described above, in the semiconductor chip 300 according to the third embodiment, even in IGBT of GGEE type is a kind of IE-type IGBT, similarly to the first and second embodiments, both the IE effect improvement and the switching loss reducing during turn-off (Eoff) can be achieved. Although the present application has been described in GE-S type and GGEE type, the present invention is not limited thereto. It is also applicable to other types of IGBT of the IE type, such as the EGE type.

Fourth Embodiment

Figure 19B:
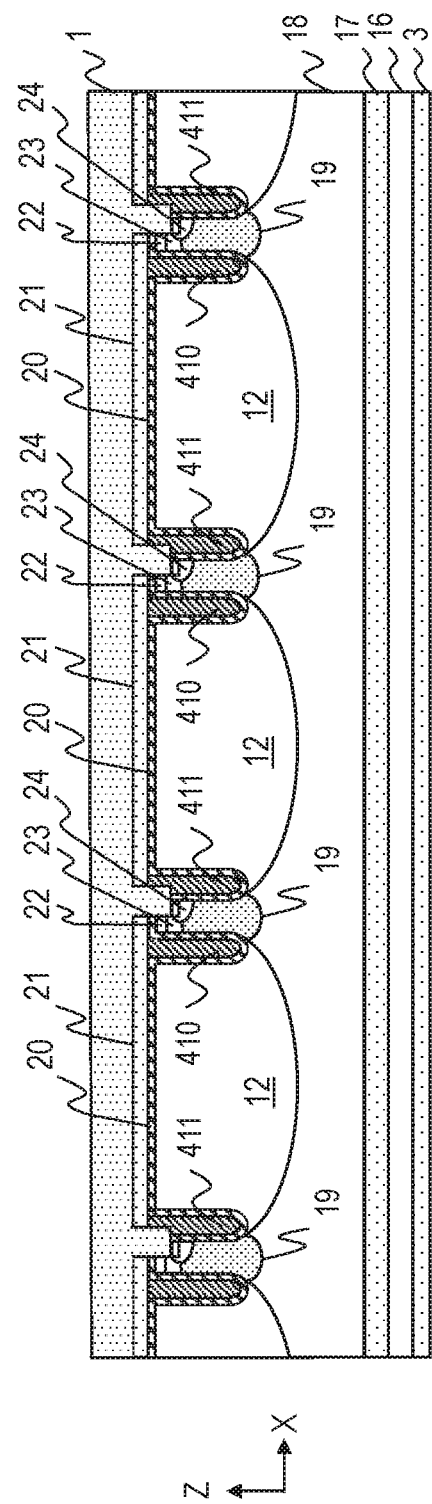
FIG. 19B is a cross-sectional view of a semiconductor chip according to the fourth embodiment.

FIG. 19A is a main portion plan view of a semiconductor chip according to a fourth embodiment, and is enlarged view of the region 4 in FIG. 1. FIG. 19B is a cross-sectional view along J-J' of FIG. 19A.

In the first to third embodiments, FC-GATE is connected to the gate electrode and controlled by the gate potential. In the fourth embodiment, FC-GATE is controlled independently rather than the gate potential. As shown in FIG. 19A, the fourth embodiment has an emitter-potential trench 411 of sixth and seventh shapes, similar to the second embodiment (FIG. 15A). That is, the emitter potential trench 411 has a first emitter potential trench electrode as a first trench electrode and a second emitter potential trench electrode as a second trench electrode. Further, the gate potential trench 410 is constituted by a linear portion extending in the Y-axis direction. An independent trench 427 separated from the gate potential trench 410 is then disposed between the sixth and seventh shapes.

A floating isolation layer 413 is formed in the region sandwiched between the sixth shape and the independent trench 427. A floating isolation layer 413 is also formed in a region sandwiched between the seventh shape and the independent trench 427. FC-GATE 414 is formed to cover the independent trench 427 and the floating isolation layers 413. FC-GATE 414, for example, is connected to FC-GATE terminal provided separately from the gate electrode 2 (not shown) using a Poly-Si.

The basic operation of the semiconductor chip according to the fourth embodiment is similar to that of second embodiment, but FC-GATE 414 can be controlled independently rather than at the gate potential. For example, for a IGBT where +15V is applied to the gate electrode when the gate is on, and 0V is applied to the gate electrode when the gate is off, +15V can be applied to FC-GATE 414 when the gate is on, and −15 V can be applied to FC-GATE 414 when the gate is off. Thereby, the same effects as those described in the first and second embodiments can be obtained. Alternatively, for a IGBT where +15V is applied to the gate electrode when the gate is on and −15V is applied to the gate electrode when the gate is off, +30V can be applied to FC-GATE 414 when the gate is on and −30V can be applied to FC-GATE 414 when the gate is off. As a result, the controllability of the inversion layer of the floating isolation layer 413 is further improved. Alternatively, the timing of the gate on/gate off and the timing of turning FC-GATE on/off can be shifted. For example, by turning FC-GATE 414 on (applying a voltage that forms an inversion layer) at a timing earlier than the timing of the gate-off, the carrier discharge suppression function functions faster. Thus, the switching loss during turn-off (Eoff) can be further reduced.

As described above, in the semiconductor chip according to the fourth embodiment, similarly to the first embodiment, it is possible to achieve both IE-effect improvement and switching loss (Eoff) reduce at turn-off. Further, it is possible to increase the flexibility of the control of the floating isolation layer 413.

It should be noted that the present invention is not limited to the above-mentioned embodiments, and various modifications can be made without departing from the gist thereof.

What is claimed is:

1. A semiconductor device comprising:
 a semiconductor substrate;
 first and second trench electrodes formed in the semiconductor substrate;
 a floating layer of a first conductivity type formed around the first and second trench electrodes;
 a floating separation layer of a second conductivity type formed between the first and second trench electrodes and contacted with the floating layer of the first conductivity type; and
 a floating layer control gate disposed above the floating separation layer of the second conductivity type.

2. The semiconductor device according to claim 1, further comprising:
 a gate electrode to which a gate potential is supplied; and
 an emitter electrode to which an emitter electrode is supplied,
 wherein the first and second trench electrodes are first and second gate potential trench electrodes to which the gate potential is supplied, and
 wherein the floating separation layer of the second conductivity type is coupled to the emitter electrode via a contact.

3. The semiconductor device according to claim 2,
 wherein the first gate potential trench electrode has a linear portion extending in a first direction in a plan view, and a bent portion extending in a second direction, and
 wherein the second gate potential trench electrode is a line-symmetrical shape with the first gate potential trench electrode with respect to a line parallel to the second direction.

4. The semiconductor device according to claim 3, wherein the floating separation layer of the second conductivity type is disposed between the bent portion of the first gate potential trench electrode and the bent portion of the second gate potential trench electrode.

5. The semiconductor device according to claim 4, wherein the bent portion extending in the second direction has a shape being bent from the linear portion in the second direction and returning to the linear portion.

6. The semiconductor device according to claim 4,
 wherein the bent portion extending in the second direction has a shape being bent in a second direction from a first point of the linear portion and returning to a second point of the linear portion, and
 wherein a distance between the first and second points is longer than a distance between the bent portion of the first gate potential trench electrode and the bent portion of the second gate potential trench electrode.

7. The semiconductor device according to claim 6, further comprising:
 a diffusion layer of the first conductivity type disposed on the floating separation layer of the second conductivity type.

8. The semiconductor device according to claim 7, further comprising:
 a diffusion layer of the second conductivity type disposed on the diffusion layer of the first conductivity type.

9. The semiconductor device according to claim 2, further comprising:
 a body layer of the first conductivity type coupled to the emitter electrode through the contact,
 wherein the floating separation layer of the second conductivity type is formed so as to cover the body layer of the first conductivity type.

10. The semiconductor device according to claim 2, wherein the floating layer control gate is coupled to the gate electrode.

11. The semiconductor device according to claim 1, further comprising:
 a gate electrode to which a gate potential is supplied; and
 an emitter electrode to which an emitter potential is supplied,
 wherein the first and second trench electrodes are first and second emitter potential trench electrodes to which the emitter potential is supplied, and wherein the floating separation layer of the second conductivity type is coupled to the emitter electrode via a contact.

12. The semiconductor device according to claim 11, wherein the first emitter potential trench electrode has a linear portion extending in a first direction in a plan view, and a bent portion extending in a second direction, and wherein the second emitter potential trench electrode is a line-symmetrical shape with the first emitter potential trench electrode with respect to a line parallel to the second direction.

13. The semiconductor device according to claim 12, wherein the floating separation layer of the second conductivity type is disposed between the bent portion of the first emitter potential trench electrode and the bent portion of the second emitter potential trench electrode.

14. The semiconductor device according to claim 13, wherein the bent portion extending in the second direction has a shape being bent from the linear portion in the second direction and returning to the linear portion.

15. The semiconductor device according to claim 13, wherein the bent portion extending in the second direction has a shape being further bent in the first direction and returning to the bent portion extending in the second direction.

16. The semiconductor device according to claim 12, further comprising:
    a gate potential trench electrode to which the gate potential is supplied, wherein the gate potential trench electrode is disposed in a region sandwiched between the first and second emitter potential trench electrodes, and wherein the floating separation layer of the second conductivity type is disposed between the bent portion of the first emitter potential trench electrode and the gate potential trench electrode, and between the bent portion of the second emitter potential trench electrode and the gate potential trench electrode.

17. The semiconductor device according to claim 16, wherein the gate potential trench electrode has a linear portion extending in the first direction, and a shape being bent in the second direction from the linear portion and returning to the linear portion.

18. The semiconductor device according to claim 1, further comprising:
    an active cell region formed in the semiconductor substrate; and
    a termination region formed so as to surround the active cell region,
    wherein a plurality of regions each of where the first and second trench electrode, the floating separation layer of the second conductivity type and the floating layer control gate are formed is arranged in the active cell region, and
    wherein an arrangement density of the regions in a central portion of the active cell region is lower than an arrangement density of the regions in a vicinity of the termination region.

19. The semiconductor device according to claim 1, wherein the semiconductor device is an IE-type IGBT.

* * * * *